(12) United States Patent
Tomita et al.

(10) Patent No.: US 11,600,514 B2
(45) Date of Patent: Mar. 7, 2023

(54) SUBSTRATE HOLDING DEVICE

(71) Applicant: EBARA CORPORATION, Tokyo (JP)

(72) Inventors: Masaki Tomita, Tokyo (JP); Junitsu Yamakawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 545 days.

(21) Appl. No.: 16/630,963

(22) PCT Filed: Jun. 25, 2018

(86) PCT No.: PCT/JP2018/023930
§ 371 (c)(1),
(2) Date: Jan. 14, 2020

(87) PCT Pub. No.: WO2019/012967
PCT Pub. Date: Jan. 17, 2019

(65) Prior Publication Data
US 2020/0258768 A1   Aug. 13, 2020

(30) Foreign Application Priority Data
Jul. 14, 2017   (JP) .............................. JP2017-137924

(51) Int. Cl.
*H01L 21/683* (2006.01)
*B25J 15/06* (2006.01)
(Continued)

(52) U.S. Cl.
CPC .......... *H01L 21/6838* (2013.01); *B25J 15/06* (2013.01); *B65G 49/06* (2013.01); *C25D 17/06* (2013.01); *H01L 21/67259* (2013.01)

(58) Field of Classification Search
CPC ........... H01L 21/6838; H01L 21/67259; H01L 21/67718; H01L 21/68707;
(Continued)

(56) References Cited

U.S. PATENT DOCUMENTS 9,390,950 B2 * 7/2016 Sorabji .................. H01L 21/68
9,457,477 B1 * 10/2016 Rublee ................. B25J 15/0023
(Continued)

FOREIGN PATENT DOCUMENTS

JP   H09-199456 A    7/1997
JP   2002-319613 A   10/2002
(Continued)

OTHER PUBLICATIONS

International Patent Application No. PCT/JP2018/023930; Int'l Search Report; dated Sep. 18, 2018; 2 pages.

*Primary Examiner* — Stephen A Vu
(74) *Attorney, Agent, or Firm* — BakerHostetler

(57) ABSTRACT

Provided is a substrate holding device that inhibits drop in holding accuracy of a substrate. A Bernoulli chucking pad suctions and holds a front surface or a back surface of a substrate S. A position determiner 54 is capable of pushing the substrate S in contact with a side surface 82 of the substrate S, and positioning the suctioned substrate S. A pin 66 enables the position determiner 54 to come in contact with the side surface 82 of the substrate S. The pin 66 brings the position determiner 54 into contact with the side surface 82 of the substrate S, and the position determiner 54 thereby positions the substrate S.

12 Claims, 16 Drawing Sheets

(51) Int. Cl.
  *B65G 49/06* (2006.01)
  *C25D 17/06* (2006.01)
  *H01L 21/67* (2006.01)

(58) Field of Classification Search
  CPC .............. H01L 21/67742; H01L 21/68; H01L 21/68728; B25J 15/06; B65G 49/06; B65G 49/061; B65G 49/067; B65G 2249/045; B65G 47/91; B65G 2201/022; C25D 17/06; C25D 17/00; C25D 17/001; C25D 21/12
  See application file for complete search history.

(56) References Cited

U.S. PATENT DOCUMENTS

| | | |
|---|---|---|
| 2002/0153676 A1 | 10/2002 | Noguchi |
| 2005/0072358 A1 | 4/2005 | Katsuoka et al. |
| 2006/0216840 A1* | 9/2006 | Blomiley .......... H01L 21/67115 427/9 |
| 2006/0219179 A1* | 10/2006 | Sundar .................... H01L 21/68 118/729 |
| 2007/0215049 A1* | 9/2007 | Aderhold .......... H01L 21/68707 118/728 |
| 2008/0054197 A1 | 3/2008 | Zama et al. |
| 2010/0013626 A1* | 1/2010 | Park .................. H01L 21/67259 118/712 |
| 2010/0264132 A1* | 10/2010 | Koelmel ................. H01L 21/68 356/621 |
| 2017/0200630 A1 | 7/2017 | Miyamoto et al. |
| 2017/0294330 A1 | 10/2017 | Webb et al. |

FOREIGN PATENT DOCUMENTS

| | | |
|---|---|---|
| JP | 2003-017452 A | 1/2003 |
| JP | 2005-191464 A | 7/2005 |
| JP | 2008-060277 A | 3/2008 |
| JP | 4425801 B2 | 3/2010 |
| TW | 201622053 A | 6/2016 |
| WO | WO 2016/052632 A1 | 4/2016 |

* cited by examiner

SUBSTRATE HOLDING DEVICE

TECHNICAL FIELD

The present invention relates to a substrate holding device for holding a substrate such as a wafer.

BACKGROUND ART

A substrate treatment apparatus that treats a substrate such as a wafer includes a substrate holding device for holding a substrate to, for example, transfer the substrate. In Japanese Patent No. 4425801, disclosed is a substrate transfer robot including the substrate holding device in an electroplating apparatus. In the substrate holding device that the substrate transfer robot has, two types of hands are illustrated. A back surface chucking type vacuum hand (an upper step lower hand) that is one of the two types is a hand that transfers the substrate placed on a substrate temporary table to a preliminary washing unit. The upper step lower hand is a face-down thin evacuation type, and chucks and holds a back surface of the substrate.

The upper step lower hand does not include a positioning mechanism. When the substrate holding device holds the substrate, the device may be desired to hold a front surface side of the substrate. At this time, it is desired to suction the substrate with as weak force as possible so that a front surface of the substrate is not damaged. In a case where the substrate is suctioned with the weak force, if the hand includes no positioning mechanism as in Japanese Patent No. 4425801, a problem occurs that a holding accuracy of the substrate drops. Note that also in a case where the substrate is not suctioned with the weak force, if the substrate holding device includes the positioning mechanism, there is an advantage that the positioning mechanism can be simplified in a subsequent process.

CITATION LIST

Patent Literature

PTL 1: Japanese Patent No. 4425801

SUMMARY OF INVENTION

Technical Problem

One aspect of the present invention has been developed to solve such a problem, and an object thereof is to provide a substrate holding device that inhibits drop in holding accuracy of a substrate.

Solution to Problem

To solve the above problem, in a first aspect, there is adopted a configuration of a substrate holding device including a suctioning member capable of suctioning and holding a front surface or a back surface of a substrate, a position determiner capable of pushing the substrate in contact with a side surface of the substrate, and positioning the suctioned substrate, and a driver that enables the position determiner to come in contact with the side surface of the substrate, characterized in that the driver brings the position determiner into contact with the side surface of the substrate, and the position determiner thereby positions the substrate.

In the present embodiment, the driver brings the position determiner into contact with the side surface of the substrate, and the position determiner thereby positions the substrate, so that drop in holding accuracy of the substrate can be inhibited. For example, in a case where the substrate is suctioned with weak force in a substrate transporter for a substrate electroplating apparatus, it is preferable to manage a positioning accuracy on a substrate holding device side of the substrate transporter. The reason is that if the positioning accuracy in the substrate holding device drops, a positioning mechanism is complicated in a subsequent process.

For example, when the present embodiment is applied to the substrate transporter that transfers a quadrangular substrate to a fixing station to mount the substrate on a substrate holder, the positioning accuracy in mounting the quadrangular substrate to the fixing station can improve. Furthermore, also in an apparatus other than the electroplating apparatus or also in a semiconductor manufacturing apparatus that performs a treatment by use of a transporter or the like having a weak suction force, similar advantages are generated in transferring the substrate.

In a second aspect, there is adopted a configuration of the substrate holding device of the first aspect characterized in that a first portion of the driver is capable of coming in contact with the substrate, and when the suctioning member suctions the front surface or the back surface of the substrate, the first portion comes in contact with the substrate, to apply a force to the driver, and the driver is movable, and when the driver moves, a second portion of the driver enables the position determiner to come in contact with the side surface of the substrate and to push the substrate.

In a third aspect, there is adopted a configuration of the substrate holding device of the second aspect characterized in that the driver has a rod shape, the first portion is one end of the rod shape, the second portion is the other end of the rod shape, the position determiner includes a first component contactable with the second portion, and a second component contactable with the side surface of the substrate, and when the first portion of the driver comes in contact with the substrate and the driver moves, the second portion of the driver moves the first component of the position determiner, and when the first component of the position determiner moves, the second component of the position determiner moves to come in contact with the side surface of the substrate. As the rod shape, a pin can be adopted, and as the position determiner, a lever shape can be adopted. In this case, a lever is operated by the pin.

In a fourth aspect, there is adopted a configuration of the first aspect of the substrate holding device characterized in that the second portion of the driver is attached to the driver via an elastic body.

In a fifth aspect, there is adopted a configuration of the substrate holding device of the first aspect characterized in that the driver includes a position sensor capable of detecting that the substrate is present at a predetermined position, and outputting a signal indicating the detection, and an operation device that, upon receiving the signal, enables the position determiner to come in contact with the side surface of the substrate.

In a sixth aspect, there is adopted a configuration of the substrate holding device of the fifth aspect characterized in that the operation device operates by a magnetic force or a pressure of a gas.

In a seventh aspect, there is adopted a configuration of the substrate holding device of any one of the first to sixth aspects characterized in that the suctioning member is Bernoulli suctioning member that jets a gas to the front surface or the back surface of the substrate and thereby suctions the front surface or the back surface of the substrate that receives the jetted gas.

In an eighth aspect, there is adopted a configuration of the substrate holding device of any one of the first to seventh aspects characterized in that the substrate is rectangular.

In a ninth aspect, there is adopted a configuration of the substrate holding device of any one of the first to eighth aspects including a measuring sensor that measures a position of the substrate.

In a tenth aspect, the substrate holding device of any one of the first to ninth aspects is characterized in that the holdable substrate has a quadrangular shape, a contact portion when the position determiner comes in contact with the substrate is present on a side of the quadrangular shape, and the contact portion is present within ¼ of a length from a vertex of the quadrangular shape to the side on which the contact portion is present.

In an eleventh aspect, there is adopted a configuration of an electroplating apparatus including a transporter that transfers the substrate, a substrate attaching/detaching device that attaches and detaches the substrate to and from a substrate holder to hold the substrate, and an electroplating treatment module that receives the substrate holder holding the substrate in the substrate attaching/detaching device, to subject the substrate to an electroplating treatment, characterized in that the transporter includes the substrate holding device of any one of the first to tenth aspects, and transfers the substrate to the substrate attaching/detaching device or from the substrate attaching/detaching device.

In a twelfth aspect, there is adopted a configuration of a storage medium that stores a program to allow a computer to execute a control method of a substrate holding device capable of suctioning and holding a front surface or a back surface of a substrate, and the storage medium stores a program to allow the computer to, by a suctioning member, suction and hold the front surface or the back surface of the substrate, and to, by a driver, bring, into contact with a side surface of the substrate, a position determiner capable of pushing the substrate in contact with the side surface of the substrate, and positioning the suctioned substrate.

DESCRIPTION OF EMBODIMENTS

Hereinafter, description will be made as to embodiments of the present invention with reference to the drawings. Note that in the following respective embodiments, the same or corresponding member is denoted with the same reference sign and redundant description is omitted. Furthermore, in the present description, expressions such as "a front surface", "a rear surface", "front", "back", "up", "down", "left" and "right" will be used. These expressions indicate positions and directions on a paper surface of an illustrated drawing for convenience of explanation, and may vary in an actual arrangement during use of a device, or the like.

Figure 1:
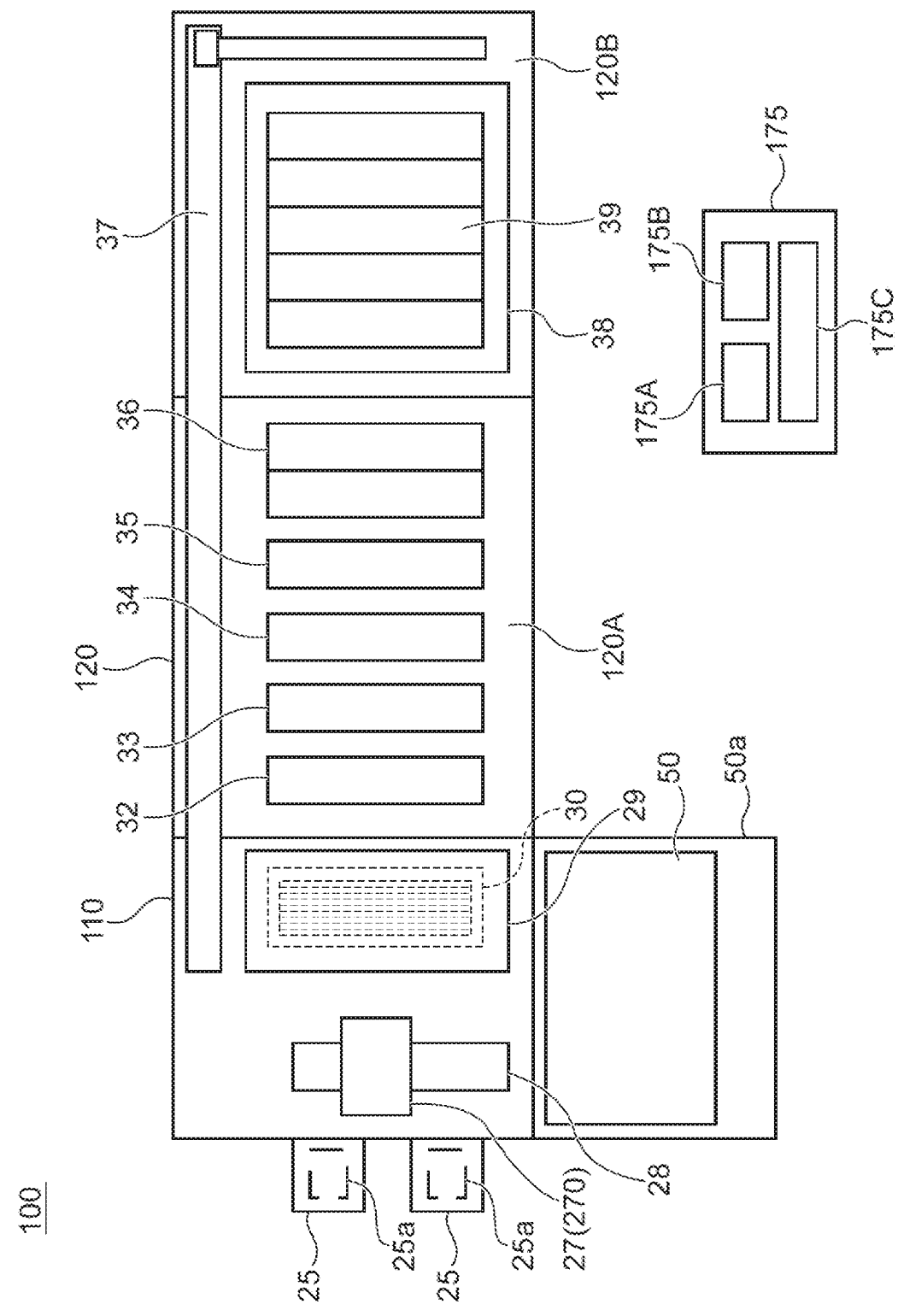
FIG. 1 is an entire arrangement view of an electroplating apparatus in which a substrate holding device according to one embodiment of the present invention is used.

FIG. 1 is an entire arrangement view of an electroplating apparatus in which a substrate holding device according to one embodiment of the present invention is used. As shown in FIG. 1, this electroplating apparatus 100 is roughly divided into a load/unload module 110 that loads a substrate on a substrate holder 1 to hold the substrate by the substrate holding device or unloads the substrate from the substrate holder 1 by the substrate holding device, a treatment module 120 that treats the substrate, and a washing module 50*a*. The treatment module 120 receives the substrate holder holding the substrate in an after-mentioned substrate attaching/detaching mechanism, to subject the substrate to an electroplating treatment. The treatment module 120 further includes a pretreatment/posttreatment module 120A that performs a pretreatment and posttreatment of the substrate, and an electroplating treatment module 120B that performs the electroplating treatment of the substrate. Note that the substrate to be treated by this electroplating apparatus 100 includes a square substrate and a circular substrate. Furthermore, the square substrate includes a polygonal such as rectangular glass substrate, a liquid crystal substrate, a printed substrate, or another polygonal electroplating object. The circular substrate includes a semiconductor wafer, a glass substrate, or another circular electroplating object.

The load/unload module 110 includes two cassette tables 25, and a substrate attaching/detaching mechanism 29 that attaches and detaches the substrate to and from the substrate holder. On each of the cassette tables 25, a cassette 25*a* is mounted in which a substrate such as the semiconductor wafer, the glass substrate, the liquid crystal substrate or the printed substrate is stored. The substrate attaching/detaching mechanism 29 is configured to attach and detach the substrate to and from the substrate holder 1 (described later in and after FIG. 14). Furthermore, near (e.g., below) the substrate attaching/detaching mechanism 29, a stocker 30 to contain the substrate holder 1 is provided. In a center among these units 25, 29 and 30, a substrate transporter 27 including a transferring robot that transfers the substrate among these units is disposed. The substrate transporter 27 includes a substrate holding device according to the present embodiment, and transfers the substrate to the substrate attaching/detaching mechanism 29 or from the substrate attaching/detaching mechanism 29. The substrate transporter 27 is configured to be runnable by a running mechanism 28.

The washing module 50a includes a washing device 50 that washes and dries the substrate subjected to the electroplating treatment. The substrate transporter 27 is configured to transfer the substrate subjected to the electroplating treatment to the washing device 50 and to remove the washed substrate from the washing device 50.

The pretreatment/posttreatment module 120A includes a pre-wet bath 32, a presoak bath 33, a pre-rinse bath 34, a blow bath 35, and a rinse bath 36. In the pre-wet bath 32, the substrate is soaked in pure water. In the presoak bath 33, an oxide film on a surface of a conductive layer such as a seed layer formed on the surface of the substrate is removed by etching. In the pre-rinse bath 34, the presoaked substrate is washed together with the substrate holder using a washing liquid (the pure water or the like). In the blow bath 35, the washed substrate is drained. In the rinse bath 36, the electroplated substrate is washed together with the substrate holder using the washing liquid. The pre-wet bath 32, the presoak bath 33, the pre-rinse bath 34, the blow bath 35 and the rinse bath 36 are arranged in this order. Note that this configuration of the pretreatment/posttreatment module 120A of the electroplating apparatus 100 is one example, and the configuration of the pretreatment/posttreatment module 120A of the electroplating apparatus 100 is not limited, so that it is possible to adopt another configuration.

The electroplating treatment module 120B includes a plurality of electroplating baths 39 including an overflow bath 38. Each electroplating bath 39 stores one substrate therein, and the substrate is soaked in an electroplating solution held inside to electroplate the surface of the substrate by copper electroplating or the like. Here, there are not any special restrictions on a type of electroplating solution, and various electroplating solutions are used in accordance with a use application.

The electroplating apparatus 100 includes a substrate holder transporter 37 that is located on a side of each of these machines to transfer the substrate holder together with the substrate between the respective machines and in which, for example, a linear motor system is adopted. The substrate holder transporter 37 is configured to transfer the substrate holder among the substrate attaching/detaching mechanism 29, the pre-wet bath 32, the presoak bath 33, the pre-rinse bath 34, the blow bath 35, the rinse bath 36, and the electroplating bath 39.

An electroplating treatment system including the electroplating apparatus 100 configured as described above includes a controller 175 configured to control each of the above described parts. The controller 175 includes a memory 175B in which a predetermined program is stored, a central processing unit (CPU) 175A that executes the program of the memory 175B, and a control module 175C achieved by the CPU 175A executing the program. The control module 175C can perform, for example, transfer control of the substrate transporter 27, attaching/detaching control of the substrate to the substrate holder in the substrate attaching/detaching mechanism 29, transfer control of the substrate holder transporter 37, control of an electroplating current and electroplating time in each electroplating bath 39, control of an aperture diameter of an anode mask (not shown) disposed in each electroplating bath 39 and an aperture diameter of a regulation plate (not shown), and the like. Furthermore, the controller 175 is configured to communicate with an unshown host controller that generally controls the electroplating apparatus 100 and another associated device, and can exchange data with a database that the host controller includes. Here, a storage medium that forms the memory 175B stores various types of setting data, an electroplating treatment program, and any type of program such as an after-mentioned transfer control program of the substrate transporter 27. As the storage medium, usable is a known medium, for example, a memory such as a computer readable ROM or RAM, a disc-shaped storage medium such as a hard disk, CD-ROM, DVD-ROM or a flexible disc, or the like.

Figure 2:
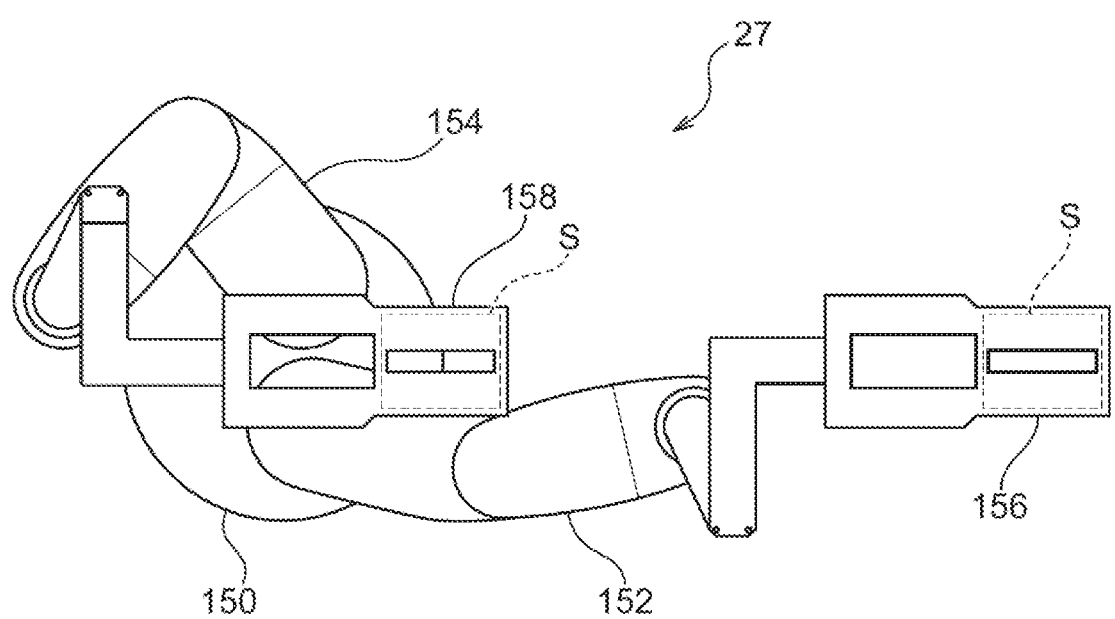
FIG. 2 is a plan view of a substrate transporter.
Figure 3:
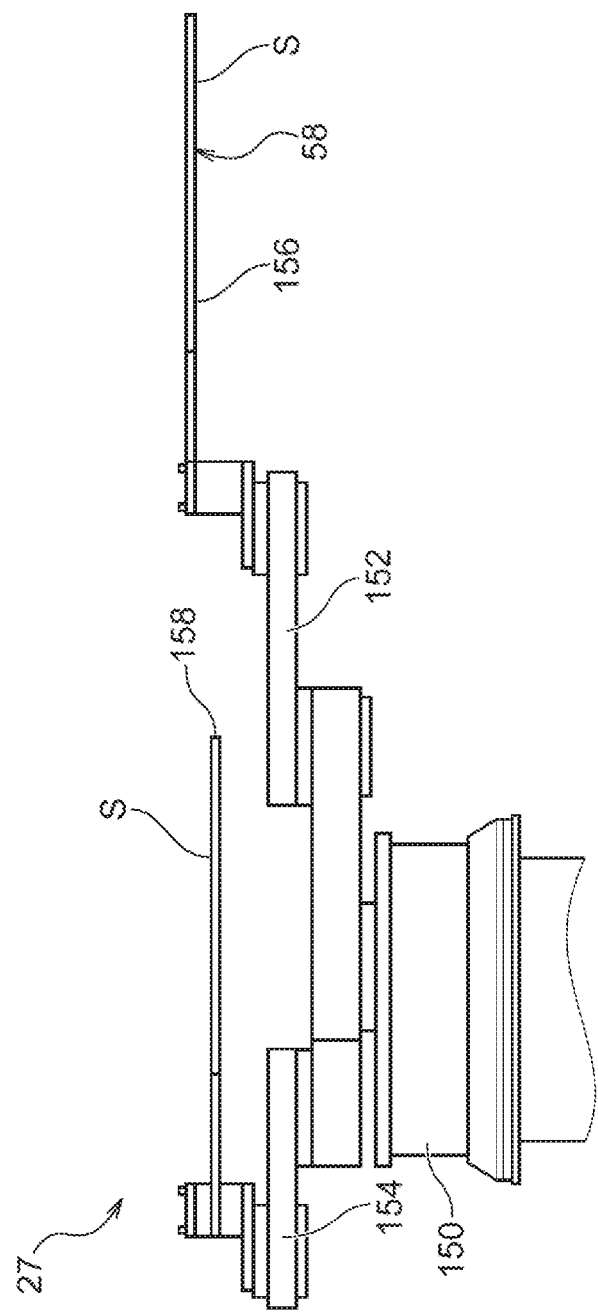
FIG. 3 is a front view of the substrate transporter.

FIG. 2 and FIG. 3 show the substrate transporter 27 disposed in the load/unload module 110. This substrate transporter 27 includes a pair of telescopic robot arms 152, 154 arranged above a robot body 150, and robot hands 156, 158 attached to tips of the respective robot arms 152, 154. Furthermore, as one robot hand 156, a thin chucking type of hand having a dry specification (a dry hand of the present embodiment) is used. As the other robot hand 158, a thick drop-in type of hand having a wet specification (a wet hand) is used.

As described above, the substrate transporter 27 transfers a substrate S among the cassette table 25, the substrate attaching/detaching mechanism 29, the stocker 30, and the washing device 50, and dry substrates and wet substrates are mixed and present. Consequently, the robot hand 156 of the dry specification and the robot hand 158 of the wet specification are adopted. That is, for the transfer from the cassette table 25 to the substrate attaching/detaching mechanism 29 and the transfer from the washing device 50 to the cassette table 25, the robot hand 156 (the substrate holding device) of the dry specification is used, because the substrate has a completely dry state. For the transfer from the substrate attaching/detaching mechanism 29 to the washing device 50, the robot hand 158 of the wet specification is used, because the substrate has a wet state.

Figure 4A:
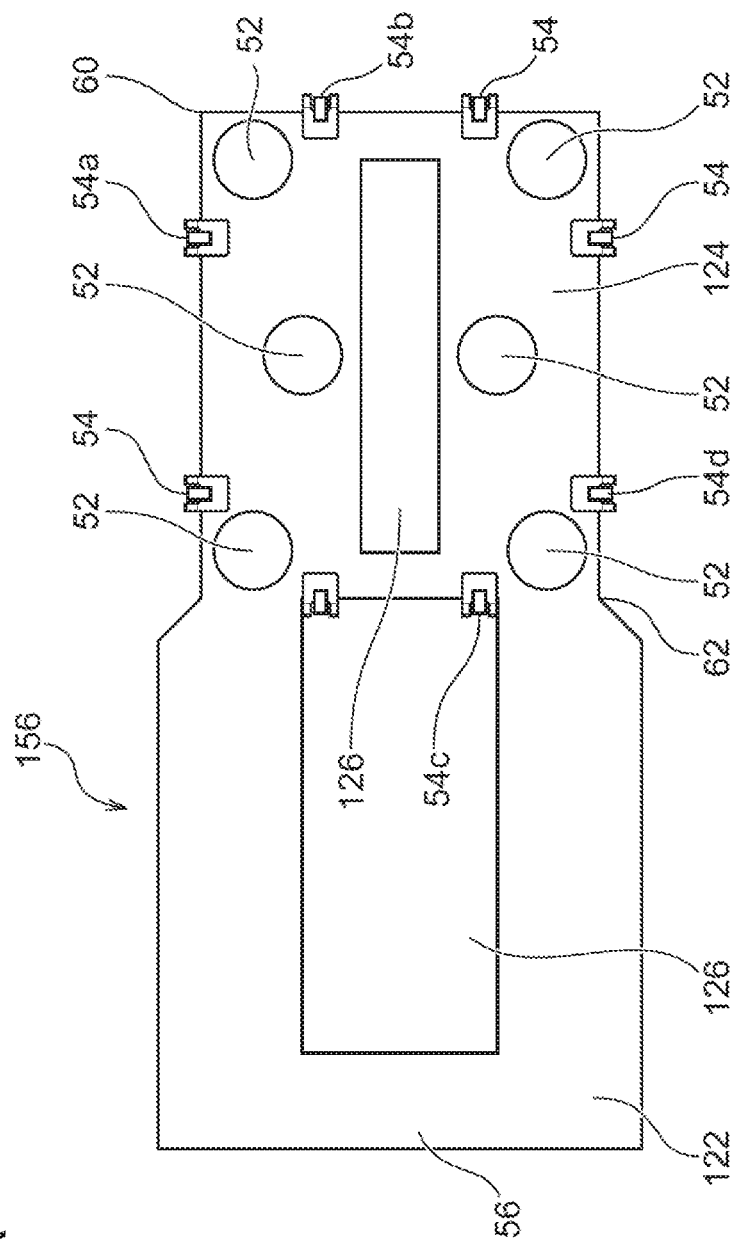
FIG. 4A shows a plan view of a robot hand 156.
Figure 4B:
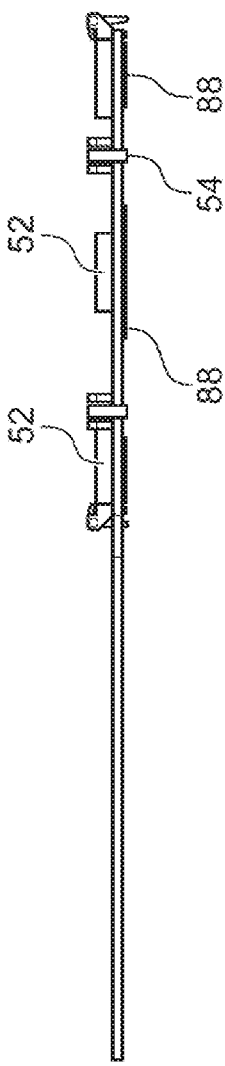
FIG. 4B shows a front view of a robot hand 156.
Figure 5:
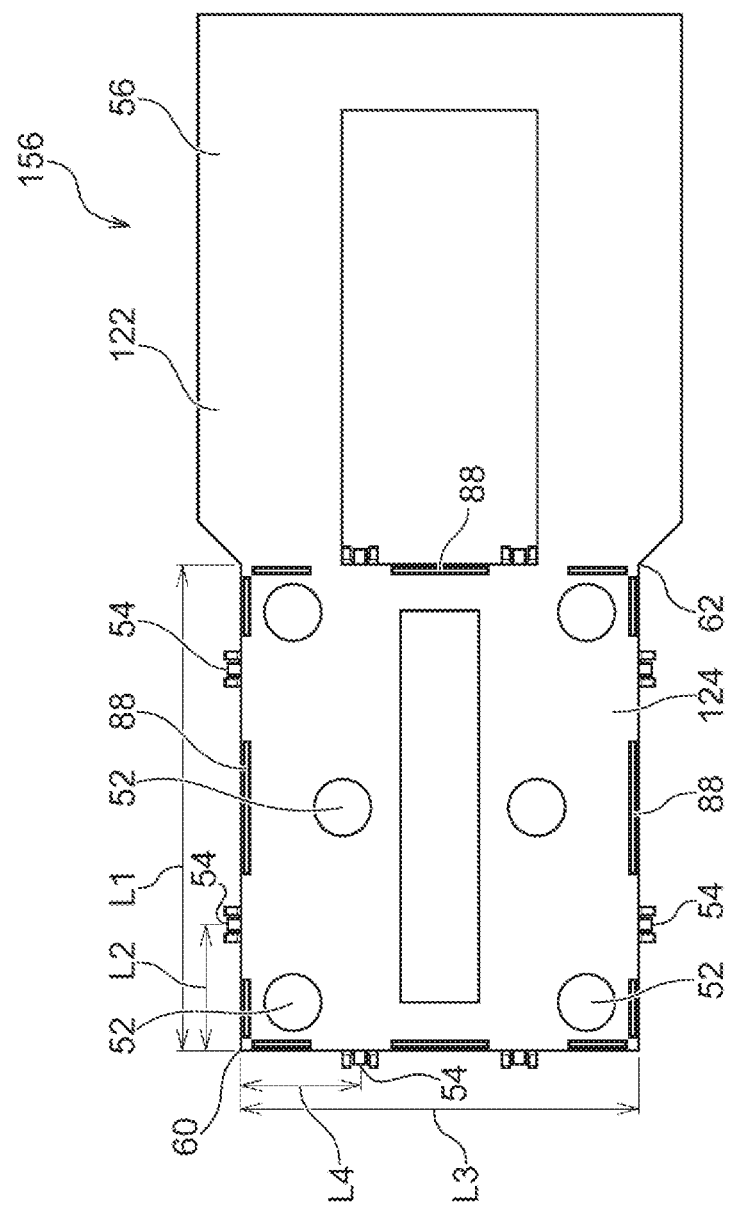
FIG. 5 is a bottom view of the robot hand 156.
Figure 6:
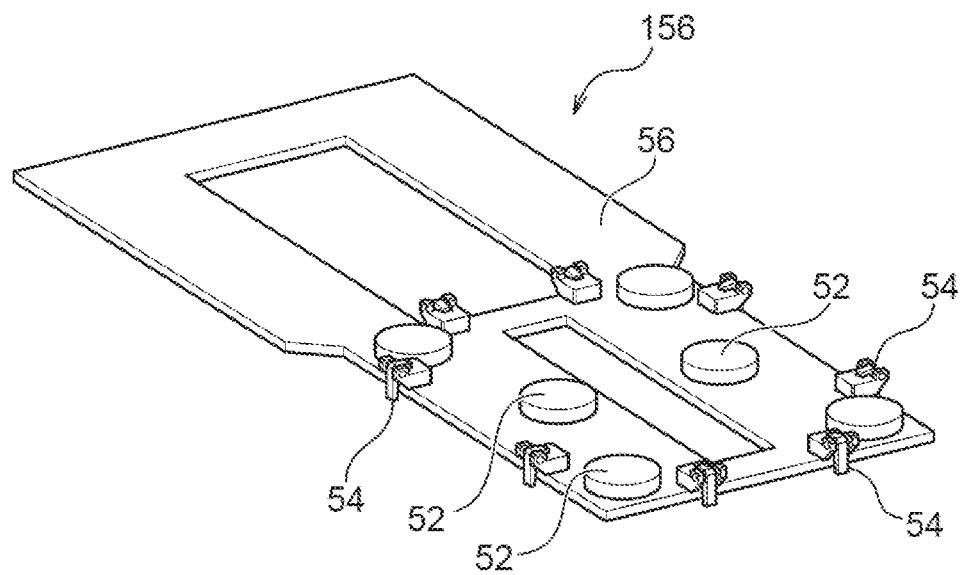
FIG. 6 is a perspective view of the robot hand 156 seen from above.
Figure 7:
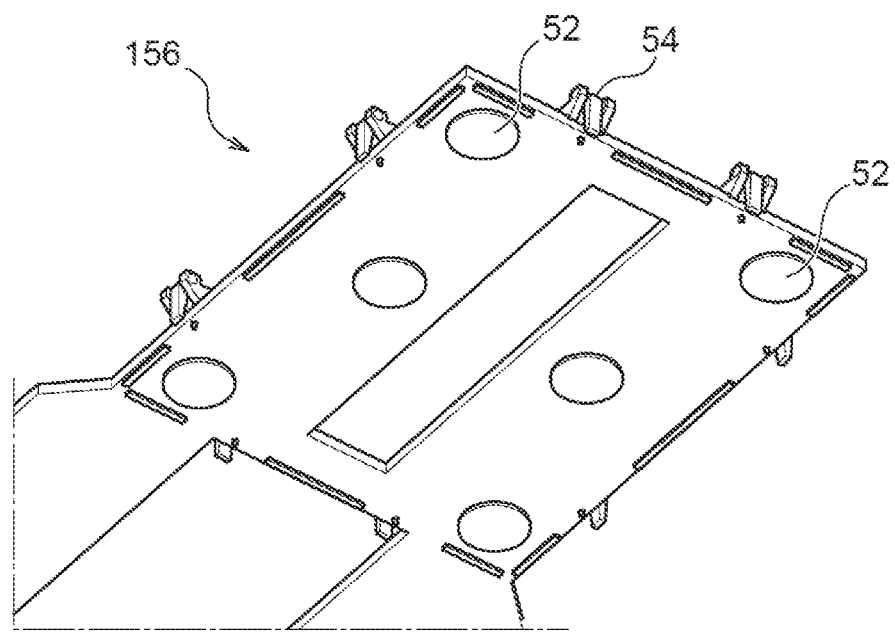
FIG. 7 is a perspective view of the robot hand 156 seen from below.

Hereinafter, description will be made as to the robot hand 156 in detail. FIG. 4A is a plan view of the robot hand 156. FIG. 4B is a front view of the robot hand 156. FIG. 5 is a bottom view of the robot hand 156. FIG. 6 is a perspective view of the robot hand 156 in an actually installed state seen from above. FIG. 7 is a perspective view of the robot hand 156 in the actually installed state seen from below.

The robot hand 156 includes a base 56, a Bernoulli chucking pad 52 (a suctioning member) capable of suctioning and holding a front surface or a back surface of the substrate S, and a position determination mechanism 54. The Bernoulli chucking pad 52 and the position determination mechanism 54 are fixed to the base 56. The base 56 includes a base portion 122 including an attaching portion to the robot arm 152, and a tip portion 124 holding the substrate S. For the base portion 122 and the tip portion 124, in the present embodiment, the substrate S is rectangular, and hence, the portions have a rectangular outer shape. It is preferable to select outer diameters of the base portion 122 and the tip portion 124 in accordance with the shape of the substrate S. The base portion 122 and the tip portion 124 have an opening 126 for weight reduction.

The Bernoulli chucking pad 52 of the present embodiment has a disc shape, and six Bernoulli chucking pads 52 extending through the base 56 are attached to the tip portion 124 of the base 56. The substrate S is disposed in a region where the Bernoulli chucking pads 52 are installed. The Bernoulli chucking pad 52 jets a gas to the front surface or the back surface of the substrate S, to suction the front surface or the back surface of the substrate S that receives the jetted gas. The Bernoulli chucking pad 52 is also called Bernoulli chuck, and suctions the substrate S by use of Bernoulli's effect in fluid dynamics indicating "fluid pressure decreases as fluid velocity increases".

As shown in FIGS. 2 and 3, the substrate S is disposed under the robot hand 156, that is, under the Bernoulli chucking pad 52. By jetting the gas from the Bernoulli chucking pad 52 to the substrate S, the substrate S that receives the jetted gas is suctioned. In FIG. 2, a high-speed air flow jets from the Bernoulli chucking pad 52 above the substrate S. On the other hand, still or slow atmosphere is present under the substrate S, and an atmospheric pressure is applied to an underside of the substrate S. Since the atmospheric pressure is larger than the pressure above the substrate S, the substrate S is suctioned toward the Bernoulli chucking pad 52.

Eight position determination mechanisms 54 are attached to a circumference of the substrate S. Two mechanisms are arranged on each of four sides of the substrate S. The numbers of the position determination mechanisms 54 and the Bernoulli chucking pads 52 are determined from a size of the substrate S, a required chucking force, or another condition. Note that two position determination mechanisms 54 present in each of corners of opposite diagonal ends of the substrate S, respectively, i.e., four in total enable positioning of the substrate S. That is, two mechanisms in each of a corner 60 shown in FIG. 4A and a corner 62 on a diagonally opposite side of the substrate S, that is, four position determination mechanisms (54a, 54b, 54c, and 54d) in total enable the positioning of the substrate S.

Note that it is preferable that a contact portion when the four position determination mechanisms (54a, 54b, 54c, and 54d) come in contact with the substrate S is present on a side of a quadrangular shape that is an outer shape of the substrate S and that the contact portion is present within ¼ of a length from a vertex of the quadrangular shape to the side on which the contact portion is present. This will be described with reference to FIG. 5. When a length of a long side of the substrate S is L1, ¼ of the length of the long side is L2, a length of a short side of the substrate S is L3, and ¼ of the long side is L4, it is preferable that the contact portion of the position determination mechanism 54 is present in a range of L2, L4 from the corner 60.

Figure 8A:
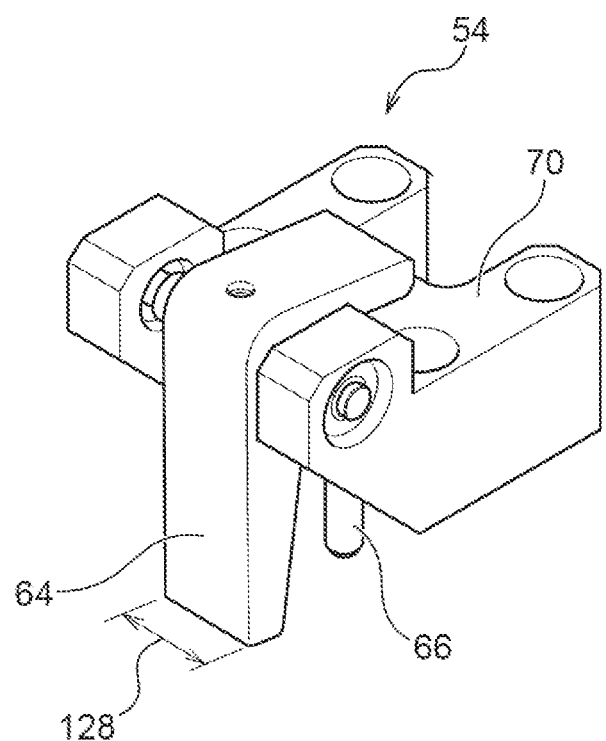
FIG. 8A is a perspective view of a position determination mechanism 54.
Figure 8B:
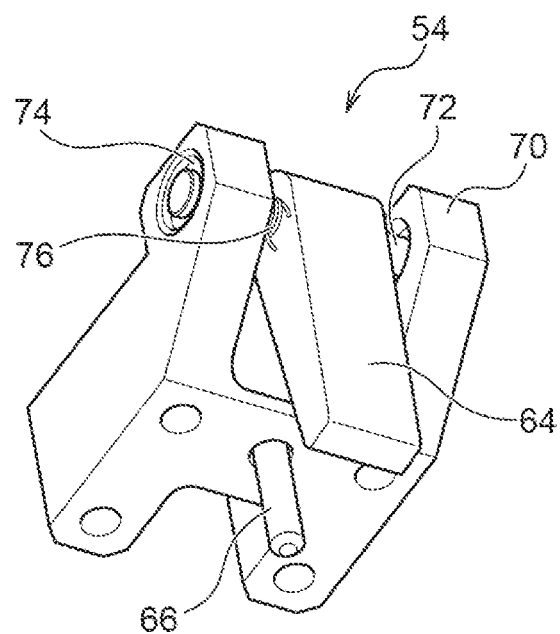
FIG. 8B is a perspective view of a position determination mechanism 54.

In the present embodiment, the contact portion is a portion where a region over a width 128 of a lever 64 described later and shown in FIGS. 8A, 8B comes in contact with the substrate S. In the present embodiment, the contact portion is linear or planar, but the contact portion is not limited to a linear or planar form. In a case where the region over the width 128 includes one or more protrusions that protrude toward the substrate S, for example, in a mountain manner, the contact portion is in the form of a point.

Figure 9:
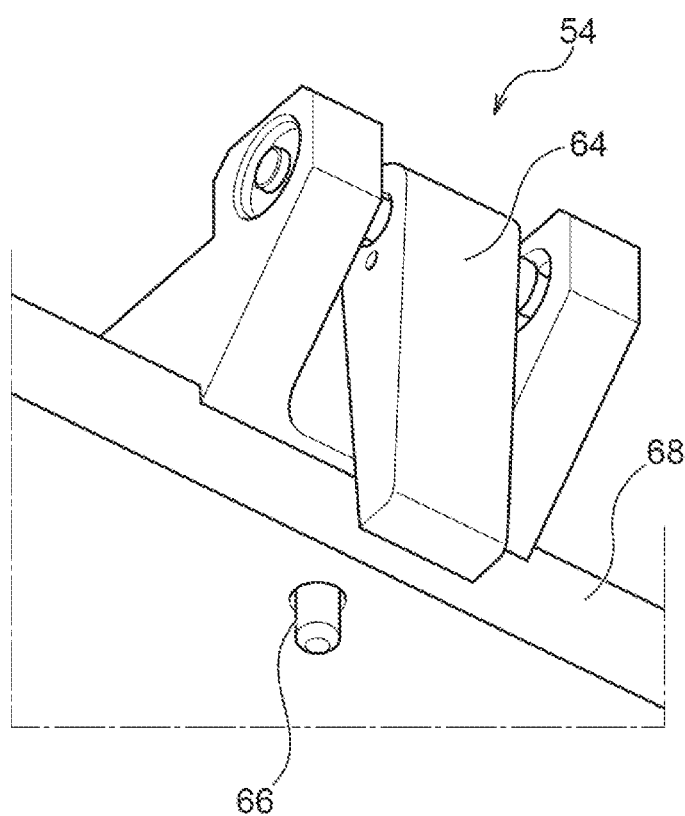
FIG. 9 is a perspective view of the position determination mechanism 54.

Next, description will be made as to the position determination mechanism 54 in detail with reference to FIGS. 8A, 8B and 9. FIG. 8A is a perspective view of the position determination mechanism 54 seen from above, and corresponds to FIG. 6. FIG. 8B is a perspective view of the position determination mechanism 54 seen from below, and corresponds to FIG. 7. FIG. 9 is a perspective view of the position determination mechanism 54 seen from below, when the position determination mechanism 54 is attached to the base 56.

The position determination mechanism 54 includes a lever 64 (a position determiner) capable of pushing the substrate S in contact with a side surface of the substrate S, and positioning the suctioned substrate S, and a pin 66 (a driver) that enables the lever 64 to come in contact with the side surface of the substrate S. The pin 66 brings the lever 64 into contact with a side surface 82 of the substrate S, and the lever 64 thereby positions the substrate S. As shown in FIG. 9, the pin 66 extends through the base 56.

The position determination mechanism 54 includes an attaching portion 70 to the base 56. The attaching portion 70 is attached to an upper surface of the base 56 with a screw or the like. The lever 64 is rotatable about a rotary shaft 72. An axial direction of the rotary shaft 72 is parallel to the surface of the substrate S. The axial direction of the rotary shaft 72 does not have to be parallel to the surface of the substrate S. The axial direction of the rotary shaft 72 is not limited, as long as the lever 64 can be rotated so that the lever 64 can be brought into contact with the side surface of the substrate S.

The rotary shaft 72 is attached to the attaching portion 70 via a bearing 74. A torsion spring 76 is provided between the lever 64 and the attaching portion 70, and the torsion spring 76 urges the lever 64 to separate the lever 64 from the side surface of the substrate S.

Figure 10:
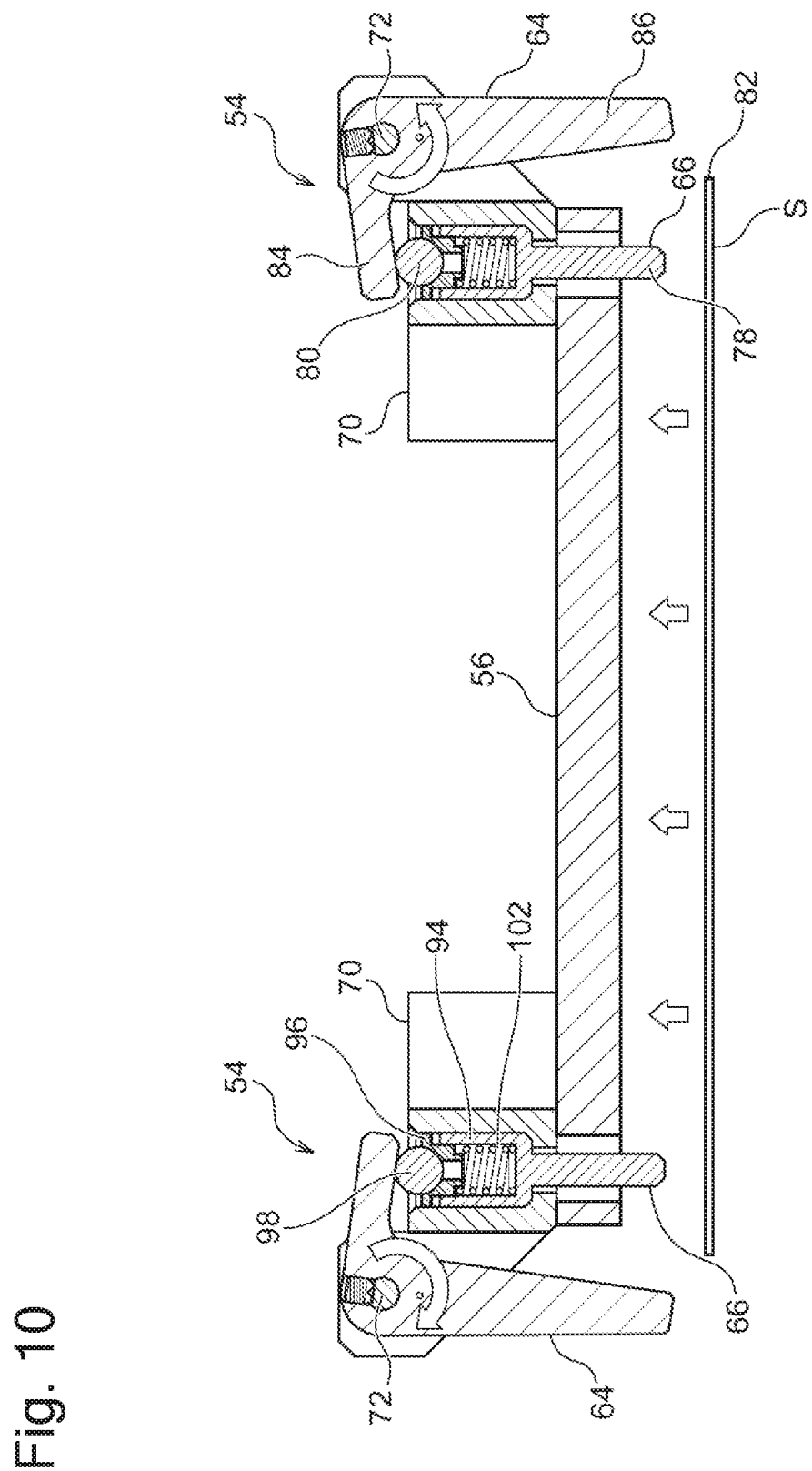
FIG. 10 is an explanatory view as to a positioning operation of the position determination mechanism 54.
Figure 11:
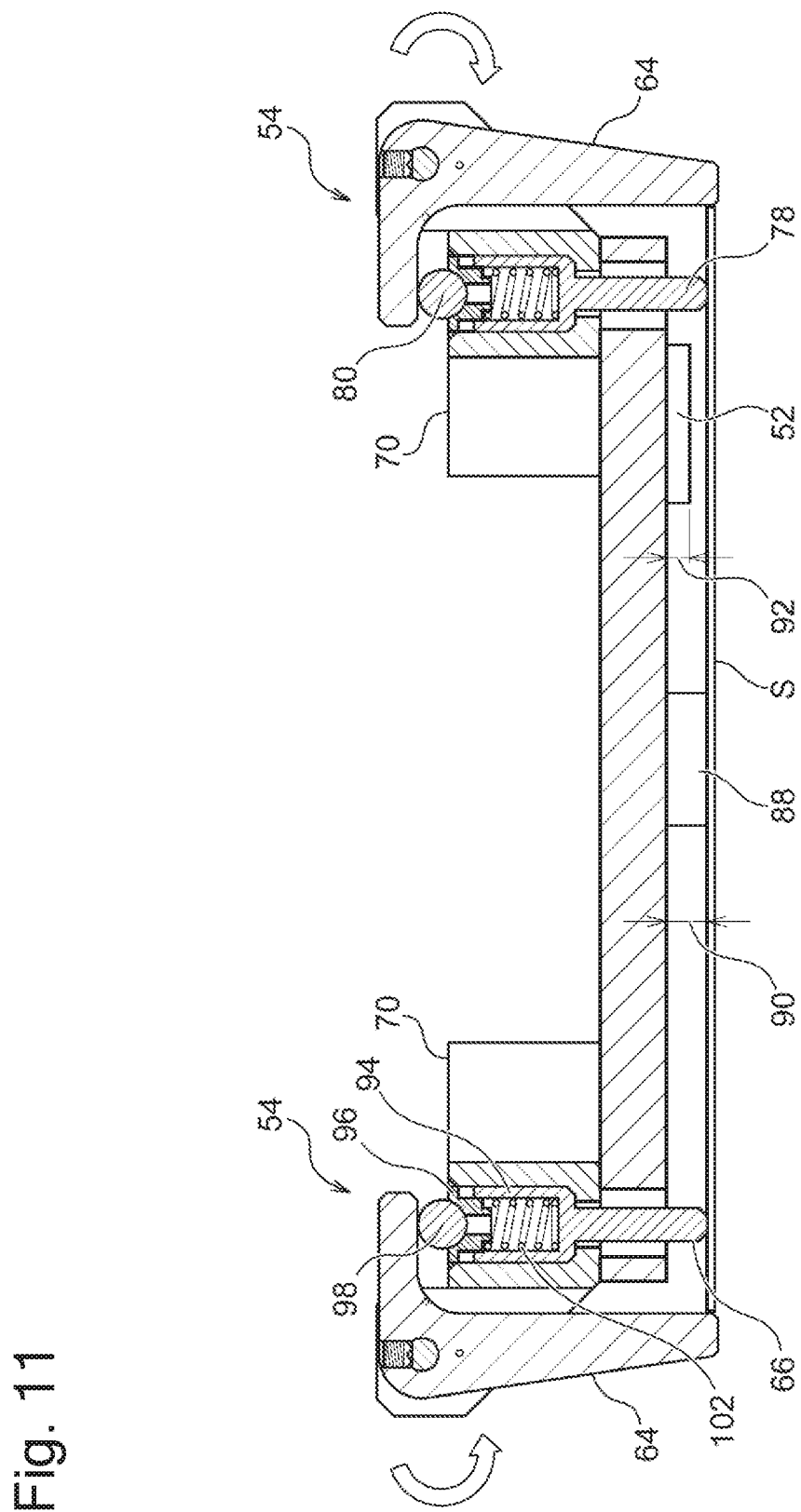
FIG. 11 is an explanatory view as to the positioning operation of the position determination mechanism 54.

Next, description will be made as to a positioning operation of the position determination mechanism 54 that performs the positioning of the substrate S by use of the position determination mechanism 54 configured as described above, with reference to FIGS. 10 and 11. FIGS. 10 and 11 are explanatory views as to the positioning operation of the position determination mechanism 54. FIG. 10 shows a state of the position determination mechanism 54 when the substrate S is suctioned by the Bernoulli chucking pad 52 and is rising. FIG. 11 shows a state of the position determination mechanism 54 when the positioning of the substrate S is completed.

In the present embodiment, a first portion 78 present at one end of the pin 66 is contactable with the substrate S. When the front surface or the back surface of the substrate S is suctioned by the Bernoulli chucking pad 52, the first portion 78 comes in contact with the substrate S, and a force is applied to the pin 66, so that the pin 66 is movable. When the pin 66 moves upward, a second portion 80 present at the other end of the pin 66 is capable of rotating the lever 64 about the rotary shaft 72, and bringing the lever 64 into contact with the side surface 82 of the substrate S, to push the substrate S.

In the present embodiment, the lever 64 can push the substrate S in a horizontal direction, but cannot hold the substrate S in a vertical direction (a gravity direction). The reason is that a force with which the lever 64 pushes the substrate S in the horizontal direction is weak, and a frictional force between the lever 64 and the side surface 82 is weak, so that the lever cannot hold the substrate S in the vertical direction (the gravity direction).

Note that the force with which the lever 64 pushes the substrate S in the horizontal direction is increased, or a tip of the lever 64 is formed in a hook shape bent toward the substrate S to engage the tip with the substrate S and the like so that the lever 64 holds the substrate S.

In the present embodiment, the pin 66 has a rod shape, the first portion 78 is one end of the rod shape, and the second portion 80 is the other end of the rod shape. The lever 64 includes a first component 84 contactable with the second portion 80, and a second component 86 contactable with the side surface of the substrate S. When the first portion 78 of the pin 66 comes in contact with the substrate S and the pin 66 moves upward, the second portion 80 of the pin 66 rotates and moves the first component 84 of the lever 64 about the rotary shaft 72. When the first component 84 of the lever 64 rotates and moves about the rotary shaft 72, the second component 86 of the lever 64 rotates and moves, to come in contact with the side surface of the substrate S. As the rod shape, a long pin can be adopted, and as the lever 64, a lever having an almost L-shape can be adopted.

The positioning operation of the position determination mechanism 54 is performed as follows. Description will be made as to a case where the substrate S is placed at a predetermined transfer start position in advance, and the placed substrate S is chucked to the base 56. (1) The torsion spring 76 retracts the second component 86 of the lever 64 outside the substrate S, before the substrate S is chucked. (2) When the Bernoulli chucking pad 52 is actuated and starts suctioning the substrate S upward, and while the substrate S is rising, the lever 64 does not move until the substrate S comes in contact with the pin 66. (3) When the substrate S comes in contact with the pin 66, a chucking force that acts on the substrate S is transmitted to the pin 66, and the substrate S rises while pushing the pin 66. At this time, the second portion 80 of the pin 66 pushes the first component 84 of the lever 64. Since the first component 84 is pushed, the lever 64 rotates, and the second component 86 of the lever 64 pushes the side surface 82 of the substrate S toward an interior of the substrate S. Since the eight position determination mechanisms 54 push the side surface 82 of the four sides of the substrate S toward the interior of the substrate S, the substrate S is placed at the predetermined position.

When the substrate S rises to come in contact with a stopper 88 disposed in a lower surface of the base 56, the rising of the substrate S stops. As shown in FIGS. 4 and 5, three stoppers 88 are arranged in each side of the base 56 in the lower surface of the base 56. A height 90 of the stopper 88 from the base 56 is set to be larger than a height 92 of the Bernoulli chucking pad 52 from the base 56. Consequently, the substrate S does not come in contact with the Bernoulli chucking pad 52. When the Bernoulli chucking pad 52 jets the gas, the force to chuck the substrate S continues. Furthermore, as long as the force to chuck the substrate S continues, the lever 64 can prevent lateral shift of the substrate S. As a result, it is possible to transfer the substrate S while holding the substrate S at the predetermined position. The reason why the stoppers 88 are provided is that if the stoppers 88 are not provided, the Bernoulli chucking pads 52 come in contact with the substrate S, and the Bernoulli chucking pads 52 cannot jet the gas, and lose the force to chuck the substrate S.

After the transfer ends, the substrate S is installed at a predetermined transfer end position. At this time, when the substrate S is released from the robot hand 156, the Bernoulli chucking pads 52 stop jetting the gas. When the jetting of the gas stops, the force to chuck the substrate S disappears, and a force for the substrate S to push the pin 66 upward also disappears. When the robot hand 156 is raised, the substrate S is not chucked, and naturally leaves from the robot hand 156. The lever 64 comes away from the side surface 82 of the substrate S by a force of the torsion spring 76. The pin 66 is pushed downward by the force of the torsion spring 76 of the lever 64 or its own weight. Note that the first component 84 is made heavy and the second component 86 is set to be light without providing the torsion spring 76. This enables the lever 64 to perform an operation similar to an operation in a case where the torsion spring 76 is provided.

Figure 12:
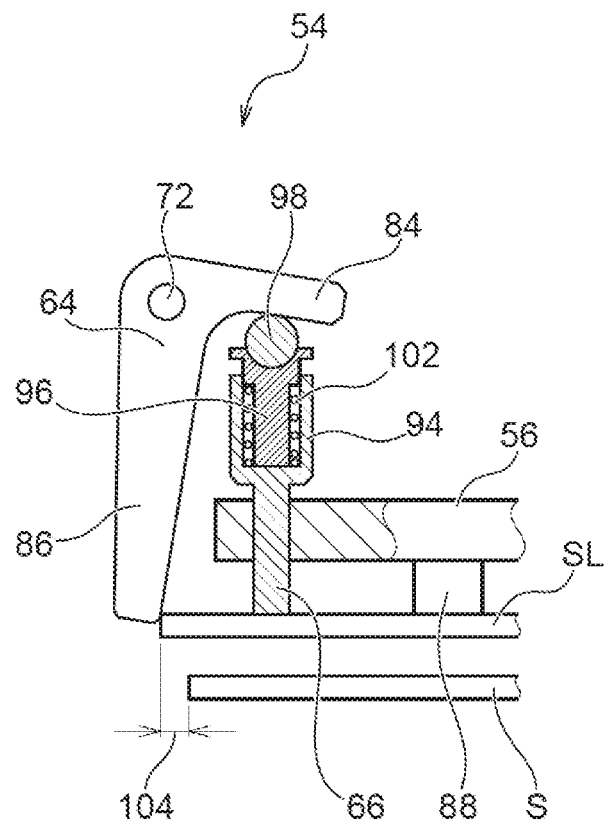
FIG. 12 is an explanatory view as to the positioning operation of the position determination mechanism 54.

Next, description will be made as to a structure of the second portion 80 of the pin 66 in detail. As shown in FIGS. 11 and 12, the second portion 80 is disposed in a cylindrical portion 94 that is an upper portion of the first portion 78. FIG. 12 does not show the attaching portion 70. A ball receiver 96 of the second portion 80 is disposed inside the cylindrical portion 94. A ball 98 is attached to an upper portion of the ball receiver 96. The ball receiver 96 is attached in the cylindrical portion 94 of the pin 66 via a spring 102 (an elastic body).

The ball receiver 96 is attached to the cylindrical portion 94 via the spring 102. Consequently, when a downward force is applied to the ball 98 and the cylindrical portion 94 does not move downward, the ball receiver 96 relatively moves downward relative to the cylindrical portion 94. "When the cylindrical portion 94 does not move", a lower end of the pin 66 abuts on the substrate S, the substrate S cannot move downward, and hence, the pin 66 cannot move downward. Since "the time when the cylindrical portion 94 does not move downward" may occur, the spring 102 is provided. Next, this will be described.

Description will be made as to the reason why the ball receiver 96 is attached in the cylindrical portion 94 of the pin 66 via the spring 102 (the elastic body), with reference to FIG. 12. The reason why the spring 102 is provided is that if the size of the substrate S is in an allowable range of the size of the substrate S but is large, the substrate is to be securely held. When the substrate S is large, the spring 102 contracts, the ball receiver 96 moves downward, and a length of the pin 66 shortens. Consequently, a substrate having a large distance between the substrate S and the base 56 and a substrate having a small distance can be held in the same manner. In the position determination mechanism 54, as shown in FIG. 11, when the substrate S abuts on the stoppers 88, a holding force of the Bernoulli chucking pad 52 is set so that the holding force of the Bernoulli chucking pad 52 is maximized. The reason is that the holding force of the Bernoulli chucking pad 52 depends on a distance between the Bernoulli chucking pad 52 and the substrate S.

As shown in FIG. 12, when the size of the substrate S is in the allowable range of the size of the substrate S but is large, the second component 86 of the lever 64 is opened outward. FIG. 12 shows the large substrate as a substrate SL, and the substrate having a smaller standard size as the substrate S. It is considered that the substrate SL is larger than the substrate S having the standard size, as much as a length 104. FIG. 12 shows that the substrate SL is chucked, the stopper 88 is in contact with the substrate SL, and the spring 102 is contracted. FIG. 12 shows the substrate S for reference in comparison of the sizes.

When the substrate SL is chucked and the stopper 88 is in contact with the substrate SL, the second component 86 is opened outward from a state of FIG. 11. Therefore, the first component 84 is present downward from the state of FIG. 11. FIG. 12 shows that the second portion 80 of the pin 66 is pushed downward from the state of FIG. 11.

If the pin 66 does not include any springs, that is, the pin has the length shown in FIG. 11 in a fixed manner, a distance between the substrate SL and the Bernoulli chucking pad 52 is longer than that in case of the height 90 shown in FIG. 11, and the holding force of the Bernoulli chucking pad 52 is not maximum. In the present embodiment, since the ball receiver 96 is attached in the cylindrical portion 94 of the pin 66 via the spring 102, the spring 102 can contract. That is, the length of the pin 66 can shorten. Therefore, the substrate SL can rise up to a position where the substrate abuts on the stopper 88. FIG. 12 shows a state where the spring 102 contracts and the substrate SL rises up to the position where the substrate abuts on the stopper 88.

According to the present embodiment described hitherto, in a case where the position of the substrate is corrected during the transfer of the substrate, the force to chuck the substrate is used, and electricity or compressed air is not used. Consequently, the robot hand 156 can be achieved at low cost and in a saved space. Furthermore, in the present embodiment, the position determination mechanisms located in at least two opposite sides can push the substrate with an almost uniform force. Consequently, even if the size of the substrate varies, a center of the substrate can be positioned at the same position.

In the embodiment described hitherto, the driver uses a chucking force of the Bernoulli chucking pad 52, but the present invention is not limited to this example. As another embodiment of the substrate holding device, the device can include a position sensor capable of detecting that the substrate S is present at a predetermined position, and outputting a signal indicating the detection, and an operation device that, upon receiving the output signal, enables the lever 64 to come in contact with the side surface 82 of the substrate S. In this aspect, the operation device can operate with a magnetic force or a pressure of a gas.

Figure 13:
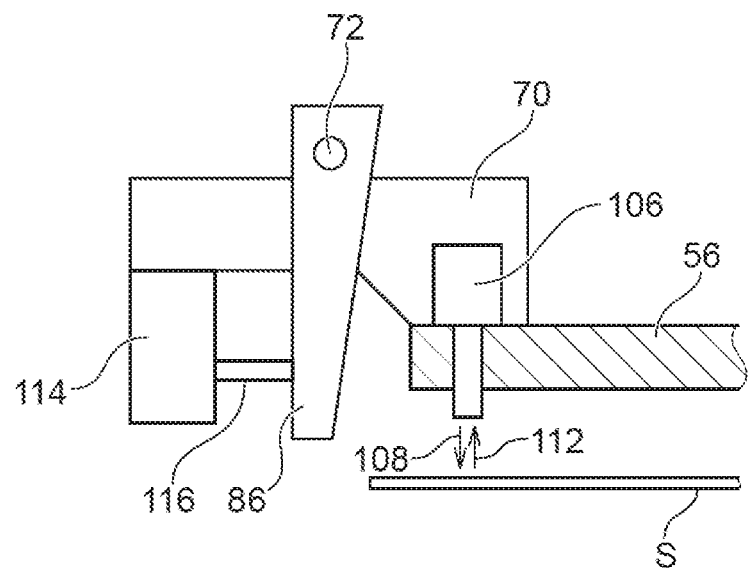
FIG. 13 is an explanatory view as to another embodiment of the position determination mechanism 54.

This embodiment will be described with reference to FIG. 13. A position sensor 106 is attached to a base 56. As the position sensor 106, various systems are usable. For example, there is a triangular distance measuring method of irradiating a substrate S with light 108 from a light source (not shown), and receiving reflected light 112 by a light receiving element (not shown). When the position sensor 106 detects that the substrate S is present at a predetermined position, the position sensor 106 outputs a signal indicating the detection. An operation device 114, upon receiving the signal, brings a second component 86 of a lever 64 into contact with a side surface 82 of the substrate S. The operation device 114 includes, for example, a solenoid in which the magnetic force is used. A pin 116 driven by the solenoid is pushed against the second component 86, and the second component 86 is brought into contact with the side surface 82 of the substrate S.

Note that in the embodiment of FIGS. 10 to 13, the robot hand 156 may be provided with a separately independent measuring sensor that measures the position of the substrate S. In this case, the measuring sensor and the position determination mechanism 54 can double check whether or not the substrate S can be grasped at a correct position.

Description will be made as to the substrate attaching/detaching mechanism 29 in which the robot hand 156 described hitherto is used. The robot hand 156 holds the substrate S at the cassette table 25, and the substrate transporter 27 transfers the held substrate S from the cassette table 25 to the substrate attaching/detaching mechanism 29. In the substrate attaching/detaching mechanism 29, the substrate S is mounted to the substrate holder 1. Afterward, the substrate S is electroplated, and after the electroplating, the substrate S is removed from the substrate holder 1 in the substrate attaching/detaching mechanism 29 and held by the robot hand 156. The substrate transporter 27 transfers the held substrate S from the substrate attaching/detaching mechanism 29 to the cassette table 25.

Figure 14:
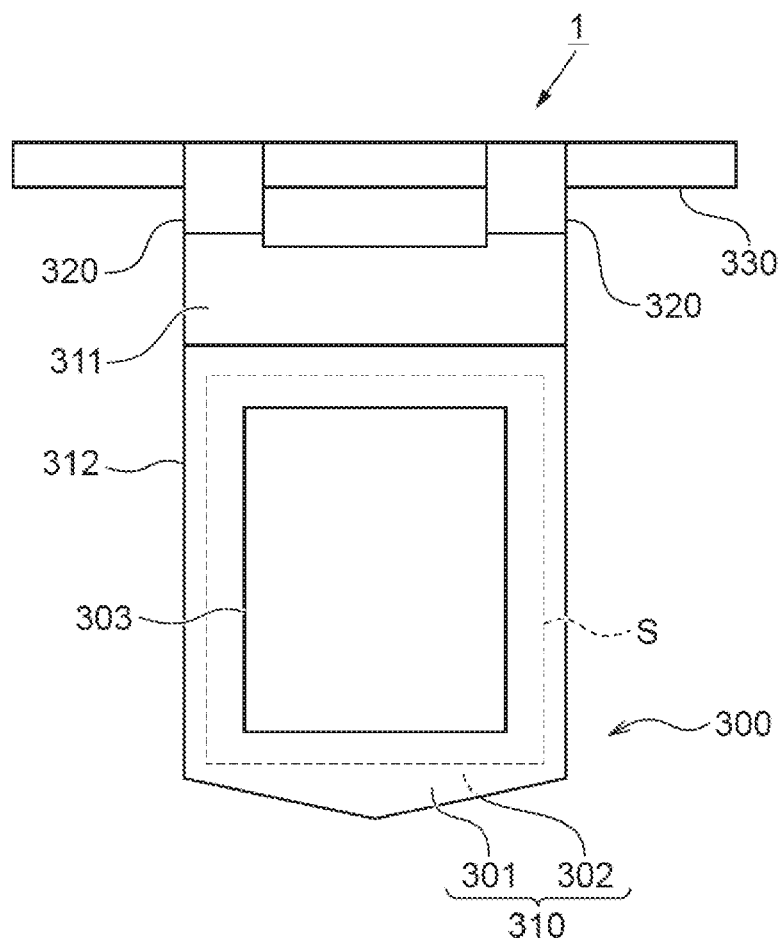
FIG. 14 is a schematic front view of a substrate holder according to one embodiment.
Figure 15:
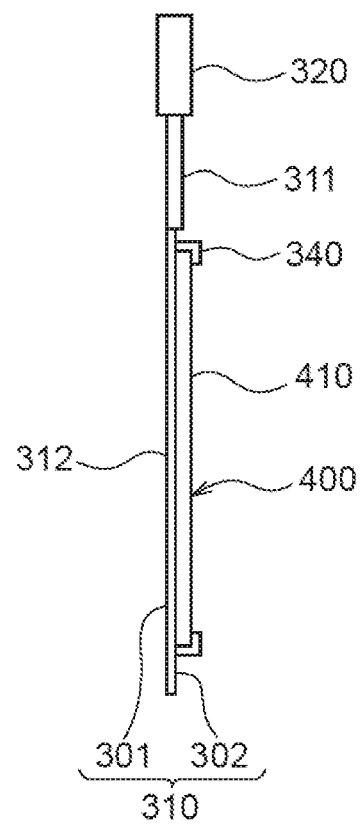
FIG. 15 is a schematic side view of the substrate holder.

First, the substrate holder 1 will be described. FIG. 14 is a schematic front view of the substrate holder according to one embodiment. FIG. 15 is a schematic side view of the substrate holder. The substrate holder 1 includes a front plate 300 and a back plate 400. The substrate S is held between the front plate 300 and the back plate 400. In the present example, the substrate holder 1 holds the substrate S in a state where one surface of the substrate S is exposed. The substrate S can be a semiconductor wafer, a glass substrate, a liquid crystal substrate, a printed substrate or another electroplated object. The substrate S has a circular, square or another shape. Note that in the following description, the square substrate will be described as an example. However, if a shape of the opening of the substrate holder 1 is changed, it is possible to hold the substrate having the circular shape or another shape.

The front plate 300 includes a front plate body 310 and an arm 330. The arm 330 is a grasping portion to be grasped by the substrate holder transporter 37, and a portion to be supported when the arm is disposed in the substrate attaching/detaching mechanism 29 and the electroplating bath 39. The substrate holder 1 is transferred in an upright state to an installation surface of the electroplating apparatus 100, and disposed in the electroplating bath 39 in the upright state.

The front plate body 310 has an almost rectangular shape, includes a wiring buffer 311 and a face 312, and has a front surface 301 and a rear surface 302. The front plate body 310 is attached to two positions of the arm 330 with attaching portions 320. An opening 303 is provided in the front plate body 310, and a surface to be electroplated of the substrate S is exposed from the opening 303. In the present embodiment, the opening 303 is formed in a rectangular shape corresponding to the rectangular substrate S. Note that in a case where the substrate S is a circular semiconductor wafer or the like, the opening 303 is also formed in a circular shape.

A back plate body 410 has a front surface that is a mounting surface of the substrate S and is attached to the rear surface 302 of the front plate body 310. On the front surface of the back plate body 410, eight clip portions 420 to hold (to fix) the substrate S are provided in total, corresponding to respective sides of the substrate S.

Figure 16:
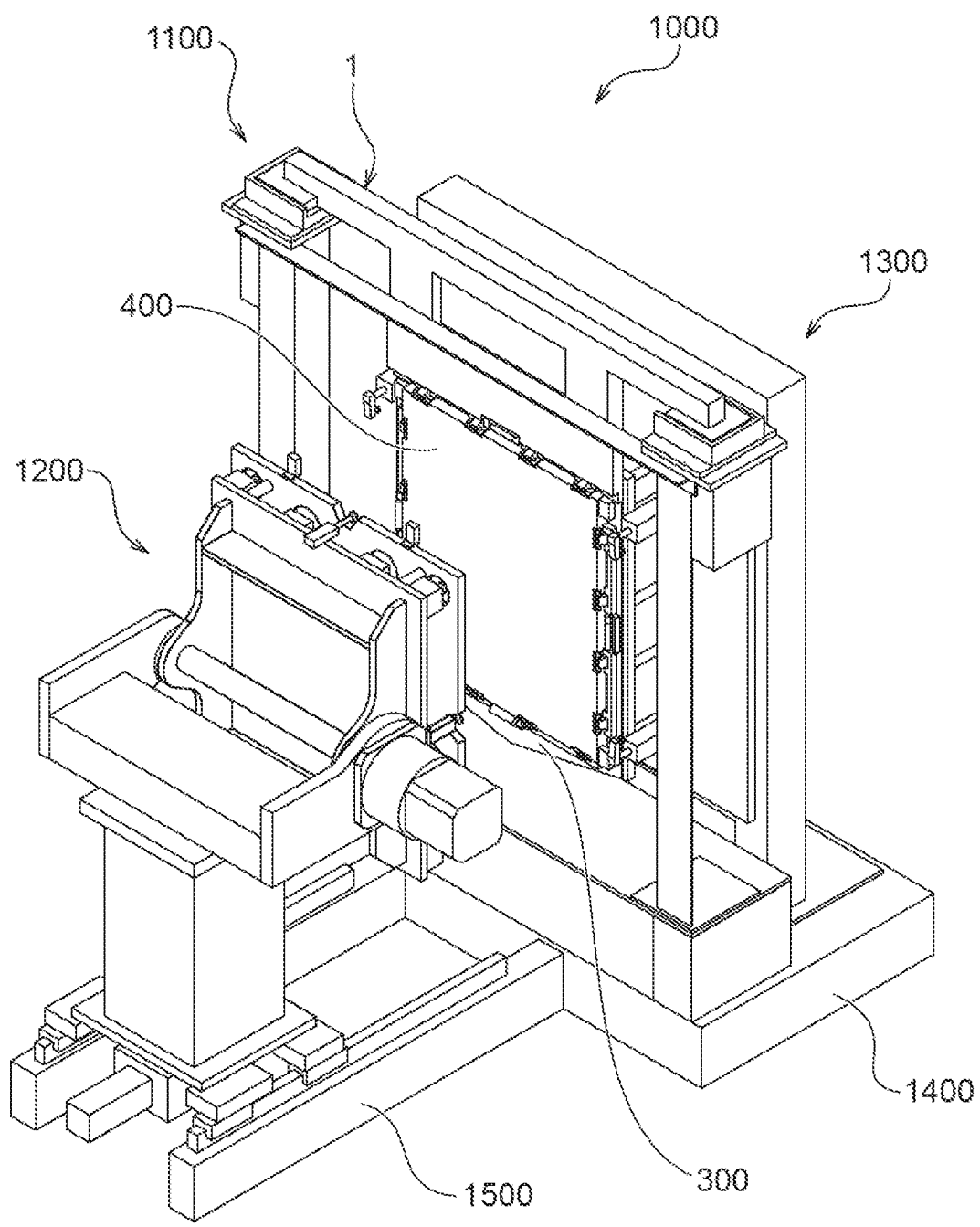
FIG. 16 is a perspective view of a substrate attaching/detaching device.
Figure 17:
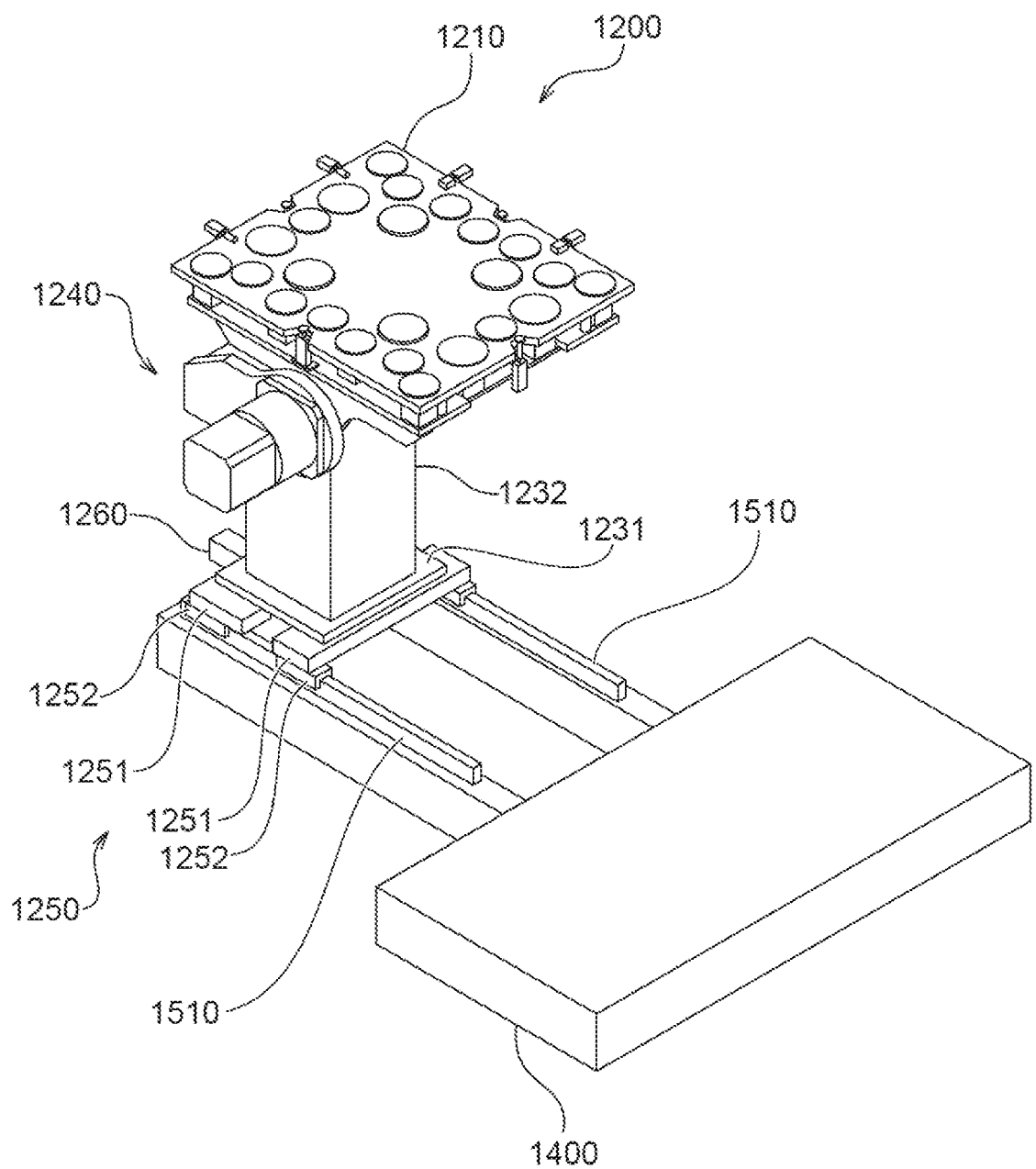
FIG. 17 is a perspective view in a second posture of a swiveling device.

Next, a substrate attaching/detaching device will be described. FIG. 16 is a perspective view of the substrate attaching/detaching device. A substrate attaching/detaching device 1000 is included in the substrate attaching/detaching mechanism 29 of FIG. 1. As shown in FIGS. 16 and 17, the substrate attaching/detaching device 1000 includes a holder station 1100, a swiveling device 1200, and a support device 1300. The holder station 1100 and the support device 1300 are fixed onto a base 1400 fixed to an installation surface. The swiveling device 1200 is attached to a forming material (a rail) 1500, and can reciprocate in a linear direction to come close to and away from the holder station 1100 along the forming material 1500. The forming material 1500 is attached to one side surface of the base 1400, and has about the same height as that of the base 1400. The swiveling device 1200 is disposed on a first side of the holder station 1100, and the support device 1300 is disposed on a second side of the holder station 1100. In the substrate attaching/detaching device 1000, in a state where the substrate holder 1 is suspended at the holder station 1100 and the substrate holder 1 is supported and fixed from a rear side in the support device 1300, the back plate 400 of the substrate holder 1 is attached and detached with the swiveling device 1200, and the substrate S is attached to and detached from the back plate 400 removed by the swiveling device 1200. Note that in a state where the substrate holder 1 is not supported by the support device 1300, the support device 1300 can be omitted.

In the following description, there is a case where a swiveling device 1200 side of the holder station 1100 and the support device 1300 is referred to as the first side or a front side, and an opposite side of the holder station 1100 and the support device 1300 is referred to as the second side or the rear side. Furthermore, there is a case where a holder station 1100 side of the swiveling device 1200 is referred to as the first side or the front side, and an opposite side of the swiveling device 1200 is referred to as the second side or the rear side. The swiveling device 1200 can take a first posture and a second posture. The first posture is a posture almost vertical to the installation surface of the substrate attaching/detaching device 1000, and the second posture is a posture almost horizontal to the installation surface. The substrate is received in a state where the back plate 400 of the substrate holder is almost horizontal, and the back plate 400 and the front plate 300 are fixed to each other in the almost vertical first posture.

FIG. 17 is a perspective view in the second posture of the swiveling device. As shown in FIG. 17, the swiveling device 1200 includes a main body 1232, a swiveling mechanism 1240, and a support plate 1210. When the swiveling device is brought in the second posture of FIG. 17, the swiveling device 1200 is retreated from a position of FIG. 16 to a swiveling position. The swiveling position is a position of the swiveling device 1200 disposed sufficiently away from the holder station 1100 so that the support plate 1210 does not interfere with the holder station 1100 during swiveling of the support plate 1210 of the swiveling device 1200.

Then, the support plate 1210 of the swiveling device 1200 is swiveled from the first posture (an upright posture) to the second posture (a horizontal posture). An electric motor 1242 of the swiveling device 1200 is driven, and the support plate 1210 is swiveled from the upright posture to the horizontal posture. Furthermore, the swiveling device 1200 is further moved from the swiveling position to a substrate transfer position. Note that the substrate transfer position is a suitable position at which the swiveling device 1200 receives the substrate S from the robot hand 156, and is a position advanced as much as a predetermined distance from the swiveling position.

Figure 18:
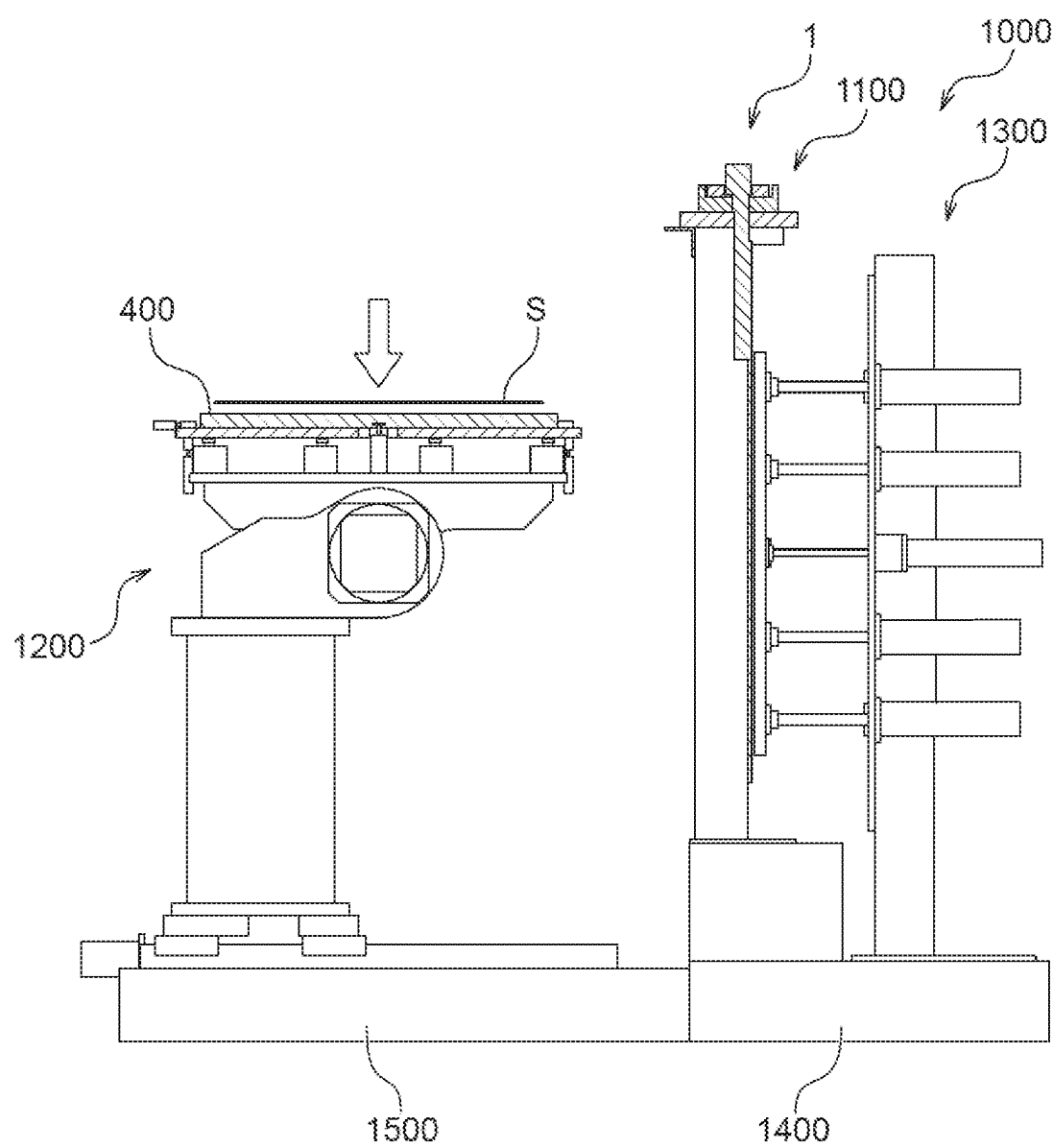
FIG. 18 is a side view of the substrate attaching/detaching device when a substrate is attached.

In the second posture, the substrate S transferred from the cassette table 25 by the robot hand 156 is mounted to the substrate holder 1. Afterward, turning to the first posture, the substrate is attached to the front plate 300 in the holder station 1100. Afterward, the substrate S is electroplated, and after the electroplating, the front plate 300 is separated from the back plate 400 in the holder station 1100. Afterward, the first posture turns to the second posture, and in the second posture, the substrate S is removed from the substrate holder 1, held by the robot hand 156, and transferred to the cassette table 25. FIG. 18 shows a side view of the substrate attaching/detaching device when the substrate is attached.

A storage medium of one embodiment of the present invention is a storage medium that stores a program to allow a computer to execute a control method of the robot hand 156 capable of suctioning and holding the front surface or the back surface of the substrate S, and the storage medium stores a program to allow the computer to, by the Bernoulli chucking pad 52, suction and hold the front surface or the back surface of the substrate S, and to, by the pin 66, bring, into contact with the side surface of the substrate S, the lever 64 capable of pushing the substrate S in contact with the side surface of the substrate S, and positioning the suctioned substrate S.

As above, the examples of the embodiments of the present invention have been described, and the above embodiments of the invention facilitate understanding of the present invention and do not restrict the present invention. The present invention can be changed and modified without departing from the gist, and needless to say, equivalents are included in the present invention. Furthermore, in a range that can solve at least a part of the above described problem or a range that produces at least a part of an effect, respective components described in claims and description can be optionally combined or omitted.

REFERENCE SIGNS LIST

27 . . . substrate transporter
29 . . . substrate attaching/detaching mechanism
37 . . . substrate holder transporter
52 . . . Bernoulli chucking pad
54 . . . position determination mechanism
64 . . . lever
66 . . . pin
68 . . . side surface
76 . . . torsion spring
78 . . . first portion
80 . . . second portion
82 . . . side surface
84 . . . first component
86 . . . second component
88 . . . stopper
94 . . . cylindrical portion
96 . . . ball receiver
98 . . . ball
102 . . . spring
106 . . . position sensor
110 . . . load/unload unit
114 . . . operation device
116 . . . pin
156 . . . robot hand
1000 . . . substrate attaching/detaching device
1100 . . . holder station
1200 . . . swiveling device

The invention claimed is:

1. A substrate holding device comprising:
a suctioning member capable of suctioning and holding a front surface or a back surface of a substrate,
a position determiner capable of pushing the substrate in contact with a side surface of the substrate, and positioning the suctioned substrate, and
a driver that enables the position determiner to come in contact with the side surface of the substrate, wherein the driver brings the position determiner into contact with the side surface of the substrate, and the position determiner thereby positions the substrate,
wherein a first portion of the driver is capable of coming in contact with the substrate,
when the suctioning member suctions the front surface or the back surface of the substrate, the first portion comes in contact with the substrate, to apply a force to the driver, and the driver is movable, and
when the driver moves, a second portion of the driver enables the position determiner to come in contact with the side surface of the substrate and to push the substrate.

2. The substrate holding device according to claim 1, wherein the driver has a rod shape, the first portion is a first end of the rod shape, the second portion is the second end of the rod shape,
the position determiner includes a first component contactable with the second portion, and a second component contactable with the side surface of the substrate,
when the first portion of the driver comes in contact with the substrate and the driver moves, the second portion of the driver moves the first component of the position determiner, and when the first component of the position determiner moves, the second component of the position determiner moves to come in contact with the side surface of the substrate.

3. The substrate holding device according to claim 1, wherein the second portion of the driver is attached to the driver via an elastic body.

4. The substrate holding device according to claim 1, wherein the suctioning member is Bernoulli suctioning member that jets a gas to the front surface or the back surface of the substrate and thereby suctions the front surface or the back surface of the substrate that receives the jetted gas.

5. The substrate holding device according to claim 1, wherein the substrate is rectangular.

6. The substrate holding device according to claim 1, comprising a measuring sensor that measures a position of the substrate.

7. The substrate holding device according to claim 1, wherein the holdable substrate has a quadrangular shape, a contact portion when the position determiner comes in contact with the substrate is present on a side of the quadrangular shape, and
the contact portion is present within ¼ of a length from a vertex of the quadrangular shape to the side of the quadrangular shape on which the contact portion is present.

8. An electroplating apparatus comprising:
a transporter, wherein the transporter comprises the substrate holding device according to claim 1, and wherein the transporter transfers the substrate,
a substrate attaching/detaching device that attaches and detaches the substrate to and from a substrate holder to hold the substrate, and
an electroplating treatment module that receives the substrate holder holding the substrate in the substrate attaching/detaching device, to subject the substrate to an electroplating treatment, and transfers the substrate to the substrate attaching/detaching device or from the substrate attaching/detaching device.

9. A substrate holding device device comprising:
a suctioning member capable of suctioning and holding a front surface or a back surface of a substrate,
a position determiner capable of pushing the substrate in contact with a side surface of the substrate, and positioning the suctioned substrate, and
a driver that enables the position determiner to come in contact with the side surface of the substrate, wherein the driver brings the position determiner into contact with the side surface of the substrate, and the position determiner thereby positions the substrate,
wherein the driver includes a position sensor capable of detecting that the substrate is present at a predetermined position, and outputting a signal indicating the detection, and
an operation device that, upon receiving the signal, enables the position determiner to come in contact with the side surface of the substrate, wherein the operation device operates by a magnetic force or a pressure of a gas.

10. A storage medium that stores a program to allow a computer to execute a control method of a substrate holding device capable of suctioning and holding a front surface or a back surface of a substrate,
the storage medium storing a program to allow the computer to:
suction and hold the front surface or the back surface of the substrate by a suctioning member; and
bring, into contact with a side surface of the substrate by a driver, a position determiner capable of pushing the substrate in contact with the side surface of the substrate, and positioning the suctioned substrate,
wherein a first portion of the driver is capable of coming in contact with the substrate,
when the suctioning member suctions the front surface or the back surface of the substrate, the first portion comes in contact with the substrate, to apply a force to the driver, and the driver is movable, and
when the driver moves, a second portion of the driver enables the position determiner to come in contact with the side surface of the substrate and to push the substrate.

11. An electroplating apparatus comprising:
a transporter that transfers a substrate,
a substrate attaching/detaching device that attaches and detaches the substrate to and from a substrate holder to hold the substrate, and
an electroplating treatment module that receives the substrate holder holding the substrate in the substrate attaching/detaching device, to subject the substrate to an electroplating treatment,
wherein the transporter includes a substrate holding device, and transfers the substrate to the substrate attaching/detaching device or from the substrate attaching/detaching device, and
the substrate holding device comprising:
a position determiner capable of pushing the substrate in contact with a side surface of the substrate, and positioning the suctioned substrate, and
a driver that enables the position determiner to come in contact with the side surface of the substrate, wherein the driver brings the position determiner into contact with the side surface of the substrate, and the position determiner thereby positions the substrate
wherein the driver includes a position sensor capable of detecting that the substrate is present at a predetermined position, and outputting a signal indicating the detection, and
an operation device that, upon receiving the signal, enables the position determiner to come in contact with the side surface of the substrate,
wherein the operation device operates by a magnetic force or a pressure of a gas.

12. A storage medium that stores a program to allow a computer to execute a control method of a substrate holding device capable of suctioning and holding a front surface or a back surface of a substrate,
the storage medium storing a program to allow the computer to:
suction and hold the front surface or the back surface of the substrate by a suctioning member; and
bring, into contact with a side surface of the substrate by a driver, a position determiner capable of pushing the substrate in contact with the side surface of the substrate, and positioning the suctioned substrate,
wherein the driver includes a position sensor capable of detecting that the substrate is present at a predetermined position, and outputting a signal indicating the detection, and
an operation device that, upon receiving the signal, enables the position determiner to come in contact with the side surface of the substrate, wherein the operation device operates by a magnetic force or a pressure of a gas.

* * * * *